United States Patent
Hanham et al.

(10) Patent No.: US 10,447,301 B2
(45) Date of Patent: Oct. 15, 2019

(54) OPTIMAL LDPC BIT FLIP DECISION

(71) Applicant: Toshiba Memory Corporation, Minato-ku, Tokyo (JP)

(72) Inventors: Paul Hanham, Wiltshire (GB); David Symons, Oxon (GB); Francesco Giorgio, Oxon (GB)

(73) Assignee: Toshiba Memory Corporation, Tokyo (JP)

( * ) Notice: Subject to any disclaimer, the term of this patent is extended or adjusted under 35 U.S.C. 154(b) by 104 days.

(21) Appl. No.: 15/702,909

(22) Filed: Sep. 13, 2017

(65) Prior Publication Data

US 2019/0081639 A1 Mar. 14, 2019

(51) Int. Cl.
| | |
|---|---|
| *H03M 13/11* | (2006.01) |
| *G06F 3/06* | (2006.01) |
| *G06F 11/10* | (2006.01) |
| *H03M 13/29* | (2006.01) |
| *H03M 13/15* | (2006.01) |

(52) U.S. Cl.
CPC ......... *H03M 13/1108* (2013.01); *G06F 3/065* (2013.01); *G06F 3/0619* (2013.01); *G06F 3/0679* (2013.01); *G06F 11/1012* (2013.01); *H03M 13/2906* (2013.01); *H03M 13/152* (2013.01)

(58) Field of Classification Search
CPC ......... H03M 13/1108; H03M 13/2906; H03M 13/152; G06F 3/0619; G06F 3/065; G06F 3/0679; G06F 11/1012
USPC ....... 714/758, 752, 763, 768, 796, 773, 774, 714/782, 786, 797, 799
See application file for complete search history.

(56) References Cited

U.S. PATENT DOCUMENTS

| | | | | |
|---|---|---|---|---|
| 4,667,327 A | * | 5/1987 | Bright | G01R 31/31853 |
| | | | | 714/775 |
| 5,157,671 A | * | 10/1992 | Karplus | H03M 13/1111 |
| | | | | 714/752 |
| 6,910,178 B1 | * | 6/2005 | Kiselev | G06F 11/183 |
| | | | | 714/797 |
| 7,103,825 B2 | | 9/2006 | Yedidia et al. | |

(Continued)

FOREIGN PATENT DOCUMENTS

EP 1643653 B1 1/2009

OTHER PUBLICATIONS

Xin Sheng Zhou et al., "Improved Iterative Bit Flipping Decoding Algorithms for LDPC Convolutional Codes," IEEE, PACRIM '07, pp. 541-544, 2007.

(Continued)

*Primary Examiner* — John J Tabone, Jr.
(74) *Attorney, Agent, or Firm* — White & Case LLP

(57) ABSTRACT

A solid state storage device comprises a non-volatile memory controller configured to store data in a non-volatile memory, wherein the stored data is encoded using a first error-correcting code and a second Low Density Parity Check (LDPC) code. The non-volatile memory controller includes a hard-decision LDPC decoder to decode encoded data received from the non-volatile memory and provide a decoded data output. The hard-decision LDPC decoder selects a voting scheme at each iteration in a sequence of iterations of decoding to determine when to implement bit flipping at a variable node amongst a plurality of check nodes, each of the plurality of check nodes connected to a plurality of variable nodes.

23 Claims, 5 Drawing Sheets

(56) References Cited

U.S. PATENT DOCUMENTS

| | | | |
|---|---|---|---|
| 8,051,363 B1* | 11/2011 | Liu | H03M 13/1117 |
| | | | 714/759 |
| 8,140,948 B2 | 3/2012 | Yue et al. | |
| 8,209,579 B2 | 6/2012 | Belogolovy | |
| 8,458,556 B2 | 6/2013 | Planjery et al. | |
| 8,694,868 B1 | 4/2014 | Chilappagari et al. | |
| 9,300,328 B1 | 3/2016 | Varnica | |
| 9,407,294 B2* | 8/2016 | Hanham | H03M 13/3715 |
| 9,411,683 B2 | 8/2016 | Kwok et al. | |
| 10,084,479 B2* | 9/2018 | Hanham | H03M 13/1108 |
| 2006/0136799 A1* | 6/2006 | Choi | H03M 13/11 |
| | | | 714/752 |
| 2007/0011586 A1* | 1/2007 | Belogolovyi | H03M 13/1111 |
| | | | 714/774 |
| 2008/0028274 A1* | 1/2008 | Lin | H03M 13/1108 |
| | | | 714/752 |
| 2009/0222711 A1* | 9/2009 | Belogolovy | H03M 13/1111 |
| | | | 714/780 |
| 2009/0249174 A1* | 10/2009 | Lamb | H03K 19/0008 |
| | | | 714/819 |
| 2010/0005373 A1* | 1/2010 | Bisen | G06F 13/4234 |
| | | | 714/797 |
| 2010/0042890 A1* | 2/2010 | Gunnam | H03M 13/1111 |
| | | | 714/752 |
| 2011/0246862 A1* | 10/2011 | Graef | H03M 13/1108 |
| | | | 714/785 |
| 2011/0293045 A1* | 12/2011 | Gross | H04L 1/005 |
| | | | 375/340 |
| 2014/0082459 A1* | 3/2014 | Li | G06F 11/1666 |
| | | | 714/773 |
| 2014/0153625 A1* | 6/2014 | Vojcic | H04L 1/005 |
| | | | 375/224 |
| 2015/0026536 A1* | 1/2015 | Hubris | G06F 11/1048 |
| | | | 714/758 |
| 2015/0052413 A1* | 2/2015 | Eleftheriou | H03M 13/1108 |
| | | | 714/758 |
| 2015/0188570 A1* | 7/2015 | Kwok | G06F 11/1076 |
| | | | 714/764 |
| 2016/0006459 A1* | 1/2016 | Hanham | H03M 13/1108 |
| | | | 714/764 |
| 2016/0006462 A1* | 1/2016 | Hanham | H03M 13/3715 |
| | | | 714/764 |
| 2016/0335160 A1 | 11/2016 | Zhang | |
| 2017/0149446 A1 | 5/2017 | Tao et al. | |

OTHER PUBLICATIONS

Junho Cho et al., "Adaptive Threshold Technique for Bit-Flipping Decoding of Low-Density Parity-Check Codes," IEEE Communications Letters, vol. 14, No. 9, Sep. 2010, pp. 857-859.

* cited by examiner

OPTIMAL LDPC BIT FLIP DECISION

FIELD OF THE INVENTION

The present disclosure relates to solid-state storage devices and methods that improve the decoding capability of a Low Density Parity Check (LDPC) Decoder

BACKGROUND

Improvements in NAND flash memory technology have led to reduced solid state device geometries and increased bit density of NAND flash memories. However, the increased bit density results in an increase in error rates of data decoded from such memories. Accordingly, there has been an increase in emphasis on improving the error correction capability provided by NAND flash memory controllers. Error correction is necessary due to the nature of the technology where reliability and endurance problems increase as flash memory density increases.

A flash memory is generally organized in units of pages which are the smallest unit which are individually programmable. A block, which is the smallest unit which can be erased, is composed of multiple pages. A page of memory is provided with a spare area, which is used for the extra bits required for error-correcting code ECC, as well as other functions such as bits for keeping track of wear leveling and other metadata. The spare area was originally sized to be large enough to accommodate enough bits to provide for ECC such as BCH (Bose Chaudhuri Hocqenghem) type codes for error correction given the expected error rates of memories at the time. BCH error correction codes are extensively used to correct read errors in NAND flash memories as they can be flexibly designed to correct a precise number of errors in a block of data (meaning that data block of a given size and expected error rate can be exactly reconstructed with certainty), wherever and however they may occur (i.e. randomly distributed, in fixed patterns or in bursts). They are also relatively simple to implement decoders. As such, BCH codes could be specifically designed to work with a given flash memory data page and spare area size.

As long as the number of errors in the memory page does not exceed the correction capability of the BCH code, the original data should be decodable by the BCH code. However, such convergence places a greater requirement burden on the system processor to cope with greater error rates in more dense NAND flash memories, along with greater requirements for longer memory endurance in enterprise computing applications as opposed to consumer applications. This has meant that BCH codes have become incapable of being economically or feasibly scaled to meet the new data requirements with higher error rates. In other words, as NAND densities increase, the bit error rates (BER) in each memory cell also increase accordingly, making BCH decoding less ideal due to the limitation imposed by the maximum error rate correction capability of the BCH code.

SUMMARY OF INVENTION

The present disclosure relates to a data storage device comprising a non-volatile memory controller configured to store data in a non-volatile memory, wherein the stored data is encoded using a first error-correcting code (ECC) and a second Low Density Parity Check (LDPC) error-correcting code code. The non-volatile memory controller including a hard-decision LDPC decoder to decode encoded data received with errors from the non-volatile memory and provide a decoded data output. Further the hard-decision LDPC decoder selecting a voting scheme at each iteration in a sequence of iterations of decoding to determine when to implement bit flipping at a variable node amongst a plurality of check nodes, each of the plurality of check nodes connected to a plurality of variable nodes.

In certain implementations, the hard-decision LDPC decoder reduces the number of errors in the decoded data to give partially decoded data containing errors where the first error-correcting code is capable of fully correcting the errors contained in the partially decoded data. This provides for a hybrid decoder that benefits from hard-decision LDPC decoding and ECC decoding. In other implementations, the solid state storage device further comprises an ECC decoder which completely decodes the partially decoded data containing errors to give fully decoded data containing no errors. In some implementations, the ECC decoder is a Bose-Chaudhuri-Hocquenghem (BCH) decoder.

In certain implementations, the LDPC decoder selects the voting scheme based on majority voting with a vote count offset with an adjustment value. In other implementations, the adjustment value is dependent on an iteration sequence number of the iteration in the sequence of iterations used by the hard-decision LDPC decoder. In some implementations, the adjustment value is predetermined. In certain implementations, the adjustment value for the first iteration is 1, the adjustment value for the last iteration is 0, and the adjustment value for each of the iterations between the first and last iterations is −1.

In some implementations, the hard-decision LDPC decoder flips the vote on a variable node from a previous iteration when $2F>N+1+V_{it}$, wherein F is the number of votes to flip on the check nodes and the variable node connected to the check nodes, N is the number of connected check nodes connected to a variable node, and $V_{it}$ is an adjustment value at iteration it. In certain implementations, the hard-decision LDPC decoder retains the vote on a variable node from a previous iteration when $2F=N+1+V_{it}$, wherein F is the number of votes to flip on the check nodes and the variable node connected to the check nodes, N is the number of connected check nodes connected to a variable node, and $V_{it}$ is an adjustment value at iteration it. In other implementations, the hard-decision LDPC decoder does not flip the vote on a variable node from a previous iteration when $2F<N+1+V_{it}$, wherein F is the number of votes to flip on the check nodes and the variable node connected to the check nodes, N is the number of connected check nodes connected to a variable node, and $V_{it}$ is an adjustment value at iteration it.

The present disclosure also relates to a method of improving the decoding of data encoded with first error-correcting code (ECC) and a second Low Density Parity Check (LDPC) error-correcting code, implemented in a non-volatile memory having a non-volatile memory controller configured to store data in the non-volatile memory. The method comprises selecting a voting scheme at each iteration in a sequence of iterations of hard-decision LDPC decoder of the second LDPC error-correcting code to determine when to implement bit flipping at a variable node amongst a plurality of check nodes, each of the plurality of check nodes connected to a plurality of variable nodes.

In some implementations, the hard-decision LDPC decoder reduces the number of errors in the decoded data to give partially decoded data containing errors which the first error-correcting code can correct. In other implementations, the non-volatile memory further comprises an ECC decoder which completely decodes the partially decoded data containing errors to give fully decoded data containing no errors. In certain implementations, the ECC decoder is a Bose-Chaudhuri-Hocquenghem (BCH) decoder. In some implementations, the LDPC decoder selects the voting scheme based on majority voting with a vote count offset with an adjustment value. In other implementations, the adjustment value is dependent on an iteration sequence number of each iteration in the sequence of iterations used by the hard-decision LDPC decoder. In certain implementations, the adjustment value is predetermined. In certain implementations, the adjustment value for the first iteration is 1, the adjustment value for the last iteration is 0, and the adjustment value for each of the iterations between the first and last iterations is −1.

In some implementations, the hard-decision LDPC decoder flips the vote on a variable node from a previous iteration when $2F>N+1+V_{it}$, wherein F is the number of votes to flip on the check nodes and the variable node connected to the check nodes, N is the number of connected check nodes connected to a variable node, and $V_{it}$ is an adjustment value at iteration it. In certain implementations, the hard-decision LDPC decoder retains the vote on a variable node from a previous iteration when $2F=N+1+V_{it}$, wherein F is the number of votes to flip on the check nodes and the variable node connected to the check nodes, N is the number of connected check nodes connected to a variable node, and $V_{it}$ is an adjustment value at iteration it. In other implementations, the hard-decision LDPC decoder does not flip the vote on a variable node from a previous iteration when $2F<N+1+V_{it}$, wherein F is the number of votes to flip on the check nodes and the variable node connected to the check nodes, N is the number of connected check nodes connected to a variable node, and $V_{it}$ is an adjustment value at iteration it.

Further, the present disclosure also relates to a solid state storage device comprising a non-volatile memory controller configured to store data in a non-volatile memory, wherein the stored data is encoded using a first error-correcting code and a second Low Density Parity Check (LDPC) error-correcting code. The non-volatile memory controller includes a hard-decision LDPC decoder to decode encoded data received from the non-volatile memory to generate partially decoded data which the first error-correcting code can correct. The non-volatile memory controller also includes a decoder of the first error-correcting code that receives the partially decoded data containing errors and generates fully decoded data containing no errors. Further, the non-volatile memory controller includes the hard-decision LDPC decoder selecting a voting scheme at each iteration in a sequence of iterations of decoding to determine when to implement bit flipping at a variable node amongst a plurality of check nodes, each of the plurality of check nodes connected to a plurality of variable nodes.

Variations and modifications will occur to those of skill in the art after reviewing this disclosure. The disclosed features may be implemented, in any combination and subcombination (including multiple dependent combinations and subcombinations), with one or more other features described herein. The various features described or illustrated above, including any components thereof, may be combined or integrated in other systems. Moreover, certain features may be omitted or not implemented.

BRIEF DESCRIPTION OF THE DRAWINGS

The foregoing and other objects and advantages will be apparent upon consideration of the following detailed description, taken in conjunction with the accompanying drawings, in which like reference characters refer to like parts throughout, and in which.

DETAILED DESCRIPTION

Complex LDPC decoding schemes have been proposed, such as that described in U.S. patent application Ser. No. 14/325,256, the contents of which is hereby incorporated by reference in its entirety. Such decoders use a voting scheme that uses LDPC syndrome values as a way to dynamically adjust a voting algorithm for LDPC decoding. Such dynamic adjustment varies a strength requirement for bit flipping within a hard-decision LDPC decoder. However, the disadvantage of such a decoding scheme is its overall complexity, and that its dependence on the LDPC syndrome value means that the syndrome value needs to be calculated for all check and variable nodes of the LDPC matrix.

Figure 1:
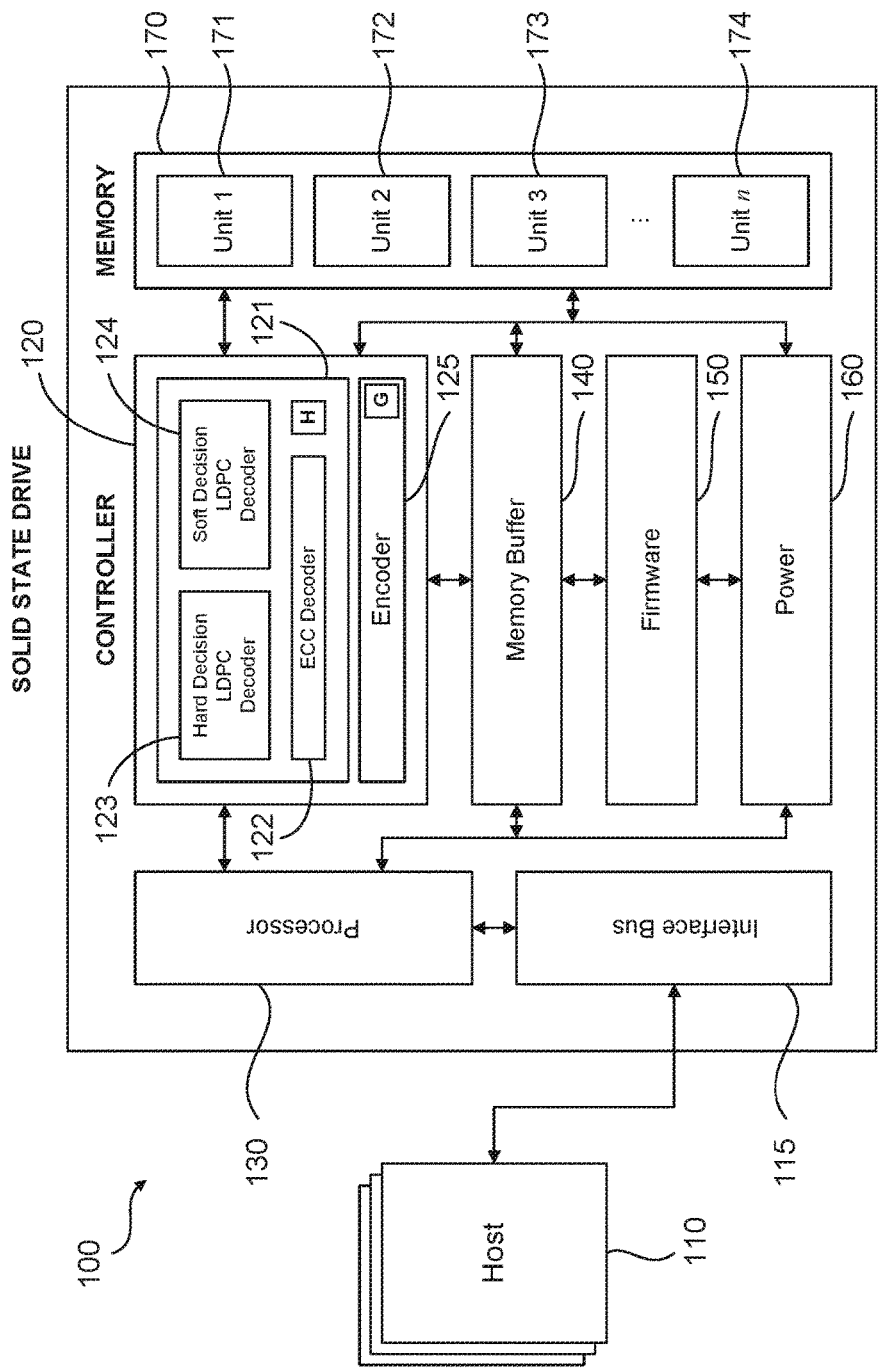
FIG. 1 shows a schematic representation of a solid-state drive (SSD), according to one or more embodiments of the present disclosure.

FIG. 1 illustrates a general solid state drive (SSD) flash memory 100 communicatively coupled to at least one host device 110 via an interface bus 115 (which may be SATA, SCSI, SAS, PCIe or similar). The SSD 100 comprises a flash memory controller 120 comprising an error correction encoder and decoder, shown in FIG. 1 as error correction encoder 125 and error correction decoder 121. The error correction decoder 121 comprises an Encryption and Error Correction Code (ECC) decoder 122 communicatively coupled to a hard-decision LDPC decoder 123 and a soft-decision LDPC decoder 124. The ECC decoder 122 may also include a BCH error corrector or any other cyclic error corrector. The hard-decision LDPC decoder 123 may also be provided with voting method adjustment. The error correction decoder 125 may comprise an LDPC encoder and an ECC encoder. Data to be written to the flash memory bank 170 is encoded by the encoder 125 by encoding with an ECC code in a first instance to give ECC-encoded data. The ECC-encoded data is then further encoded with an LDPC code in a second instance to give the fully encoded data. In order to improve the overall decoding capability of the decoder 121, the hard-decision LDPC decoder 123 first decodes the fully encoded data, providing a partially decoded output which still contains errors. This partially decoded output is then passed to the ECC decoder 122 where any remaining errors are corrected by the ECC decoder 122. It will be understood that the hard-decision LDPC decoder 123 selects a specific voting scheme at each iteration so as to ensure that the ECC decoder 122 is capable of fully correcting the number of errors in the partially decoded output from the hard-decision LDPC decoder 123.

In one implementation, a data page is passed through the hard-decision LDPC decoder 123, then a BCH error corrector included in the hard decision LDPC decoder 123 or alternatively, if required, the soft-decision LDPC decoder 124. The interface bus 115 is coupled to the controller 120 via a processor 130. In turn, the controller 120 is coupled to a flash memory bank 170 comprising a plurality of flash memories 171-174. The number of flash memory devices may vary according to the storage capacity of the individual devices and the SSD as a whole, but would typically be a power of 2 such as 4, 8, 16, 32 devices and so on.

The flash memory controller 120 may comprise a single semiconductor device with on-chip ROM for firmware storage 150 and RAM for working data structures and buffers, but there may also be provided a memory buffer 140 for additional space for large data translation tables and look-up tables. Alternatively, the on-chip ROM for firmware storage may be a NOR flash 150 so as to provide upgradeable firmware storage. To provide the various voltages required by the flash memory controller 120 and external memories 171-174, power regulation circuitry 160 may also be provided and which may also include provision for backup power using large capacitors in order to safely manage the shutdown of the SSD 100 in the event of sudden power removal or failure.

In a general implementation, upon receipt of a write command from a host device 110, the encoder 125 encodes data d transmitted from the host device 110 to the SSD 100 prior to storing the encoded data in the flash memory bank 170. In order to encode the data, the encoder 125 uses a generator matrix G to produce a codeword c, where c=Gd. The codeword is then stored in the flash memories 171-174 within the flash memory bank 170. Upon receipt of a read command from a host device 110, a codeword c' is retrieved from the flash memories 171-174. The codeword c' contains information related to the requested data in the read command. The retrieved codeword c' is received by the controller 120 and generally corresponds to an altered version of the codeword c output by the encoder 125 due to the presence of errors. The retrieved codeword c' is fed into the decoder 121 where the decoder uses a parity check matrix H and a decoding scheme iteratively to reduce the errors in the requested data d. The decoding scheme used, and hence the parity check matrix H utilized, is dependent whether the ECC decoder 122, the hard-decision LDPC decoder 123 or the soft-decision LDPC decoder 124 is used to recover the requested data d. According to an implementation of the present disclosure, hard decision LDPC decoding reduces the errors in the retrieved codeword c' to give partially decoded codeword c″ where Hc″≠0. The partially decoded codeword c″ is then fully decoded using BCH decoding, to recover data d without any errors.

Figure 2:
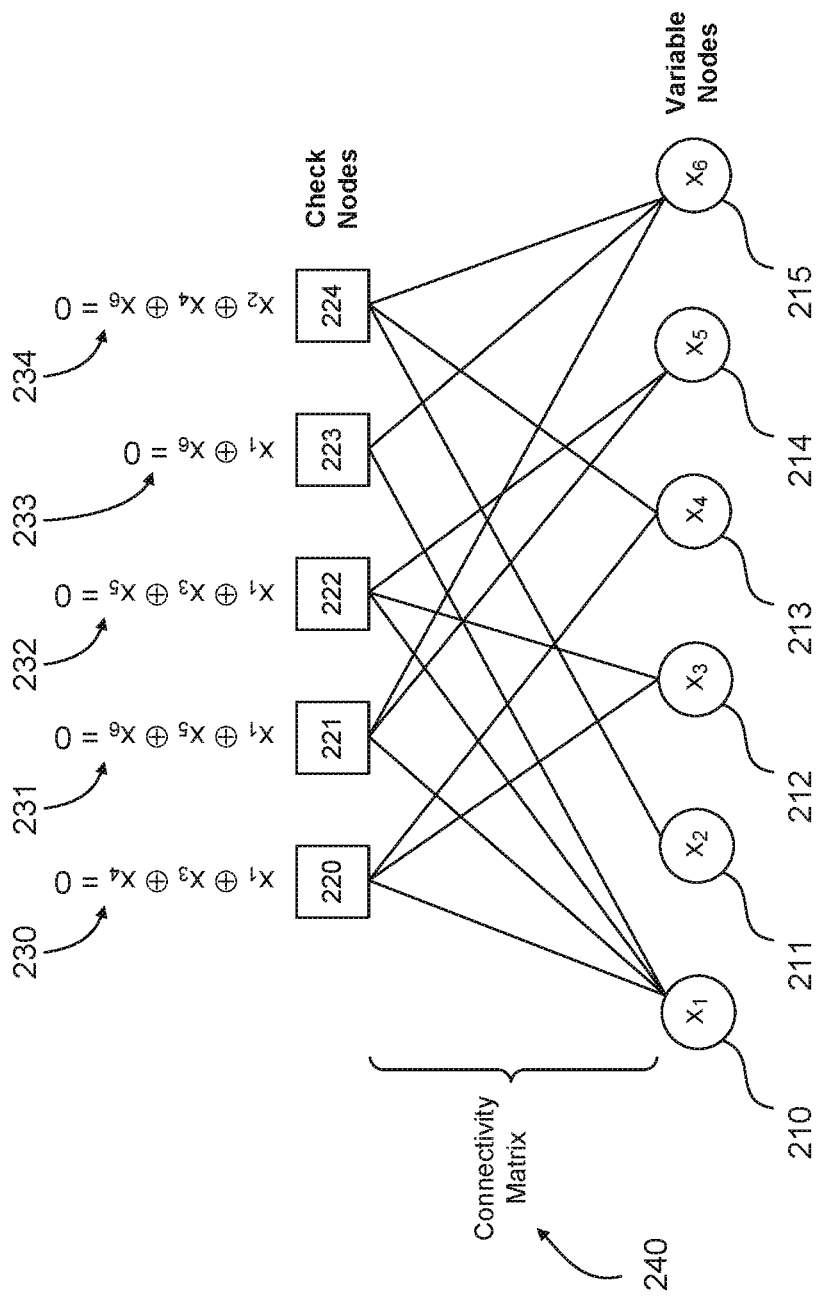
FIG. 2 illustrates an LDPC decoding scheme with check nodes and variable nodes.

FIG. 2 illustrates communications between variable nodes 210-215 representing a sampled codeword and check nodes 220-224 for decoding the codeword according to an implementation of the present disclosure. The variable nodes 210-215 and the check nodes 220-224 are connected via connectivity matrix 240 representing the LDPC parity check matrix H. The values on the variable nodes 210-215 are selected such that at any given check node 220-224 the XOR sum of the values (termed the syndrome value) on the variable nodes connected to a check node is 0. For example, for check node 220, the values $x_1$, $x_3$ and $x_4$, on variable nodes 210, 212 and 213, respectively, are such that $x_1 \oplus x_3 \oplus x_4 = 0$, i.e. the syndrome value at check node 220 is 0. As a further example, for check node 223, the values $x_1$ and $x_6$ on variable nodes 210 and 215, respectively, are such that $x_1 \oplus x_6 = 0$, i.e. the syndrome value at check node 223 is 0.

According to an implementation of the present disclosure, for hard-decision LDPC bit flipping, the hard-bit decision process can be thought of as a set of check nodes connected to a variable node, where each of the check nodes vote to (i) flip the bit on the variable node, (ii) retain the flip (or non-flip) on the variable node from the previous iteration of the LDPC decoding, or (iii) not flip the bit on the variable node and maintain it at its present value. LDPC decoders adopting hard decision bit flipping use majority voting where at each iteration of the decoding process, for each check node, the connectivity matrix 240 is followed and the XOR sum (i.e. syndrome value) calculated of variable node bits directly connected to the check-node. As previously discussed, if all XOR sums for the current iteration are 0, the decoding process ends with a successful hard decision LDPC decode.

In certain implementations of the present disclosure, the decoding process includes that at each iteration of the decoding process, adjusted majority voting for each variable node is used where the syndrome values on the check nodes directly connected to a variable node in question are used as 'votes' to determine if the bit on the variable node should be flipped, maintained at its current value, or non-flipped. For N check nodes connected to a variable node, there will be a total of N+1 votes, N votes from the check nodes and 1 vote from the current flip status of the variable node. Of these there will be F votes in favor of flipping the variable node bit. According to the hard decision LDPC decoding scheme of the present disclosure, for each iteration of the LDPC decoding, a vote on a variable node is flipped at the next iteration if F is greater than an adjusted majority vote, i.e. when $$2F > N+1+V_{it}, \quad (1)$$

where $V_{it}$ is an adjustment value. Further, a vote on the variable node is maintained at the next iteration if $$2F = N+1+V_{it}, \quad (2)$$

and a vote on the variable node is not flipped if $$2F < N+1+V_{it}. \quad (3)$$

The adjustment value $V_{it}$ is an integer offset to the simple majority vote for each iteration and is predetermined. $V_{it}$ may vary at each iteration of the decoding process.

Figure 3:
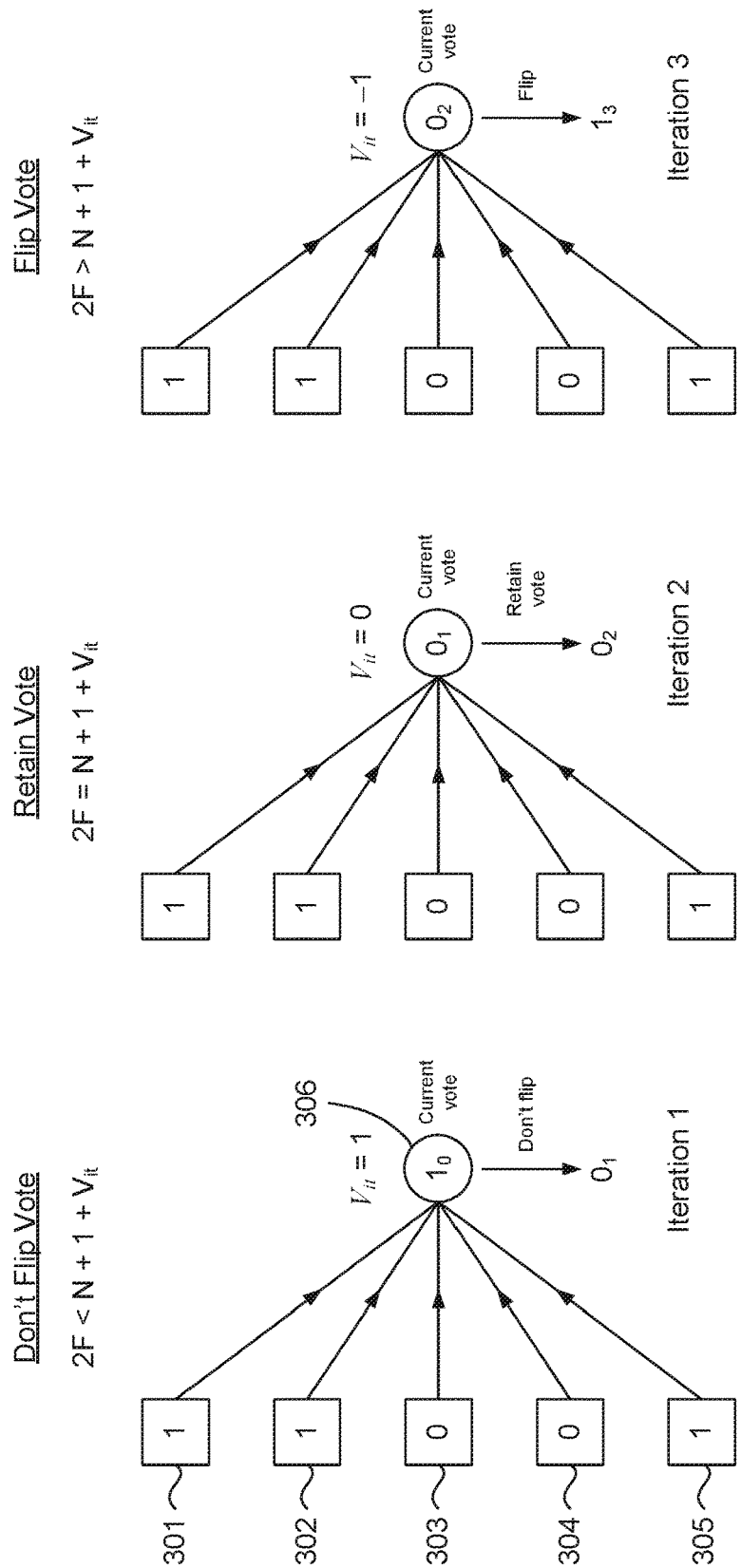
FIGS. 3A-C illustrate iterations 1 to 3, respectively, in voting of an exemplified variable node using the adjusted majority voting strategy according to an embodiment of the present disclosure.

The hard decision LDPC voting scheme will now be illustrated with respect to FIGS. 3A-C. FIGS. 3A-C illustrate sequential iterations of a hard decision LDPC decoding process where FIG. 3A corresponds to the first iteration, FIG. 3B corresponds to the second iteration, and FIG. 3C corresponds to the third iteration. The adjustment values $V_{it}$ for the three sequential iterations in FIG. 3 are {1, 0, −1}. FIG. 3A illustrates five check nodes 301-305 connected to a variable node 306. The current syndrome values on the check nodes 301-305 are {1, 1, 0, 0, 1} and the current value of the bit on the variable node 306 is '1'. In FIG. 3A this bit value is shown as $1_0$ to indicate that the bit value of '1' on the variable node 306 is from the current iteration of decoding. Thus, for Iteration 1 in FIG. 3A, N=5, $V_{it}$=1 and F=3. This means that 2F=6 and N+1+$V_{it}$=7. According to the adjusted majority voting scheme of the hard bit LDPC decoder of the present disclosure, equation (3) applies and the current value of the bit on the variable node 306 is returned to a '0' don't flip state. This is shown as $0_1$ in FIG. 3A to indicate that the value of the bit on variable node 306 is returned to '0' for Iteration 1.

FIG. 3B illustrates the decoding Iteration 2 immediately following that depicted in FIG. 3A. Here, the current value on the variable node 306 is shown as $0_1$ to indicate that the bit value is '0' as set in Iteration 1. For Iteration 2, N=5, $V_{it}=0$ and F=3. This means that 2F=6 and $N+1+V_{it}=6$. According to the adjusted majority voting scheme of the hard bit LDPC decoder of the present disclosure, equation (2) applies and the current value of the bit on the variable node 306 is retained at a '0' don't flip state. This is shown as $0_2$ in FIG. 3B to indicate that the value of the bit on variable node 306 is retained from Iteration 1 (set at $0_1$) at '0'. FIG. 3C illustrates the decoding Iteration 3 immediately following that depicted in FIG. 3B. The current value on the variable node 306 is shown as $0_2$ to indicate that the bit value is '0' as set in Iteration 2. For Iteration 3, N=5, $V_{it}=-1$ and F=3. This means that 2F=6 and $N+1+V_{it}=5$. According to the adjusted majority voting scheme of the hard bit LDPC decoder of the present disclosure, equation (1) applies and the current value of the bit on the variable node 306 is flipped to a '1'. This is shown as $1_3$ in FIG. 3C to indicate that the value of the bit on variable node 306 is flipped (set at $1_3$) to '1'.

It should be noted that while the syndrome values of the check nodes 301-305 for Iterations 1-3 in FIGS. 3A-C are shown to be constant at {1, 1, 0, 0, 1}, it may be the case that the syndrome values for check nodes 301-305 vary from iteration to iteration. This can be seen in the examples shown in Table 1 below.

TABLE 1

Vote determination using adjusted majority voting

| N | Current Check Node Syndrome | Iteration it | $V_{it}$ | F | 2F | $N + 1 + V_{it}$ | Vote |
|---|---|---|---|---|---|---|---|
| 5 | 1, 1, 0, 0, 1 | 0 | 1 | 3 | 6 | 7 | 0 (don't flip) |
| 5 | 1, 0, 1, 0, 1 | 1 | −1 | 3 | 6 | 5 | 1 (flip) |
| 5 | 1, 1, 0, 0, 1 | 2 | −1 | 4 | 8 | 5 | 1 (flip) |
| 5 | 1, 1, 0, 0, 0 | 3 | 0 | 3 | 6 | 6 | 1 (retain vote from it − 1) |
| 6 | 1, 1, 0, 0, 0, 0 | 0 | 1 | 3 | 6 | 8 | 0 (don't flip) |
| 6 | 1, 1, 0, 0, 0, 1 | 1 | −1 | 3 | 6 | 6 | 0 (retain vote from it − 1) |
| 6 | 1, 0, 0, 0, 0, 1 | 2 | −1 | 2 | 4 | 6 | 0 (don't flip) |
| 6 | 1, 0, 0, 0, 0, 0 | 3 | 0 | 1 | 2 | 7 | 0 (don't flip) |

Figure 4:
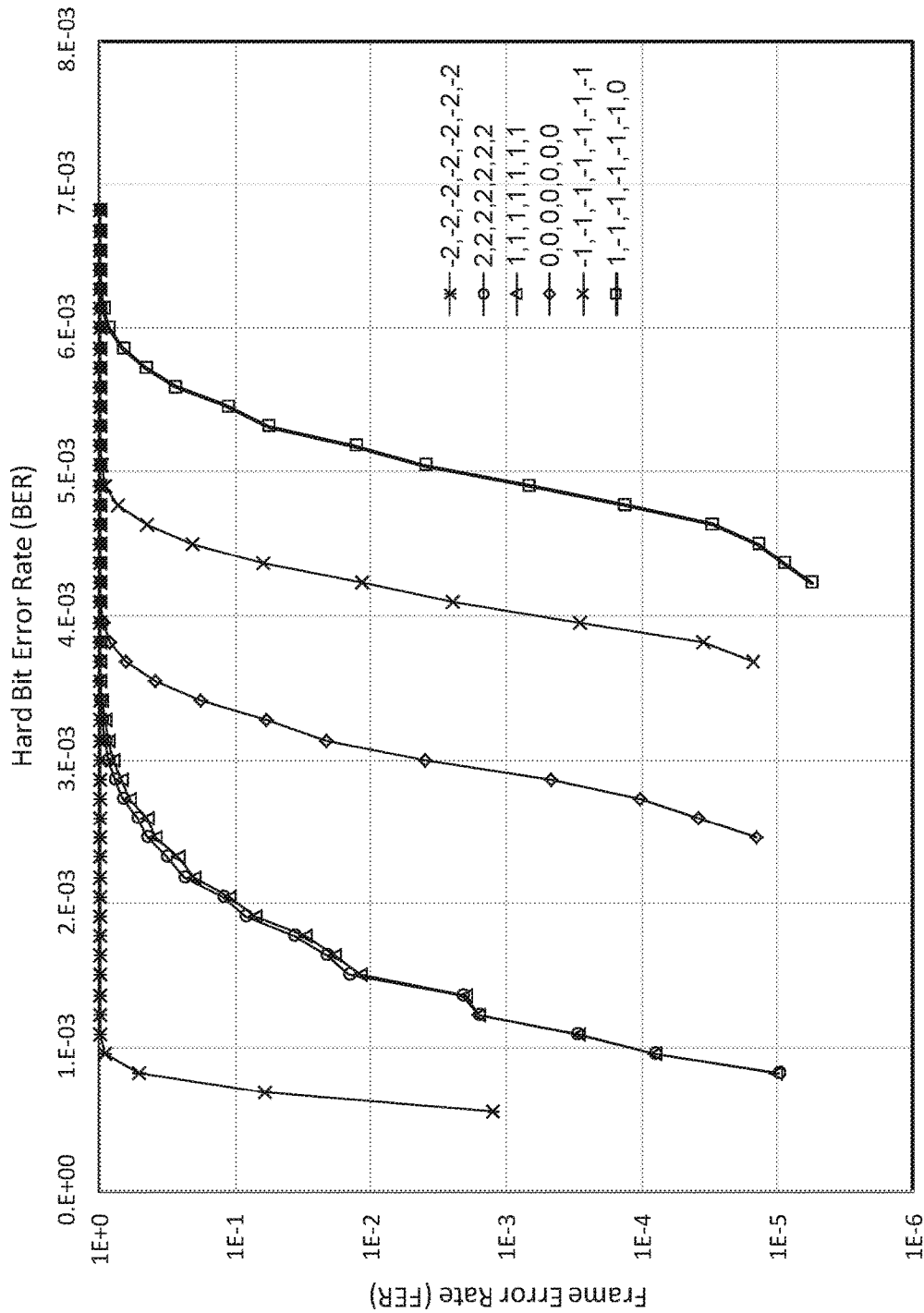
FIG. 4 illustrates the variation of hard-decision BER with frame error rate (FER), according to an embodiment of the present disclosure.

The adjustment value $V_{it}$ in the foregoing examples have taken the values of {1, 0, −1} for the three example iterations shown in FIGS. 3A-C. These adjustment values have been shown to be optimum for hard decision LDPC decoding. FIG. 4 illustrates simulation results for various adjustment values {2, 1, 0, −1, −2} for seven iterations of LDPC decoding using a FujiXpress Gen2 decoder. The simulations show the variation of frame/page error rates (FER) with hard bit BER for various adjustment values and seven iterations of LDPC decoding. According to FIG. 4, rightmost curve shows the best combination of adjustment values that give the lowest FER. Hence the optimal adjustment values to use are {1, −1, . . . −1, 0} where V=1 for the first iteration, $V_{it}=0$ for the last iteration, and $V_{it}=-1$ for iterations between the first and last.

As can be seen from equations (1)-(3), the bit flipping LDPC decoding scheme of the present disclosure is based on the simple formulation of decision and optimal iteration specific decision parameters.

Figure 5:
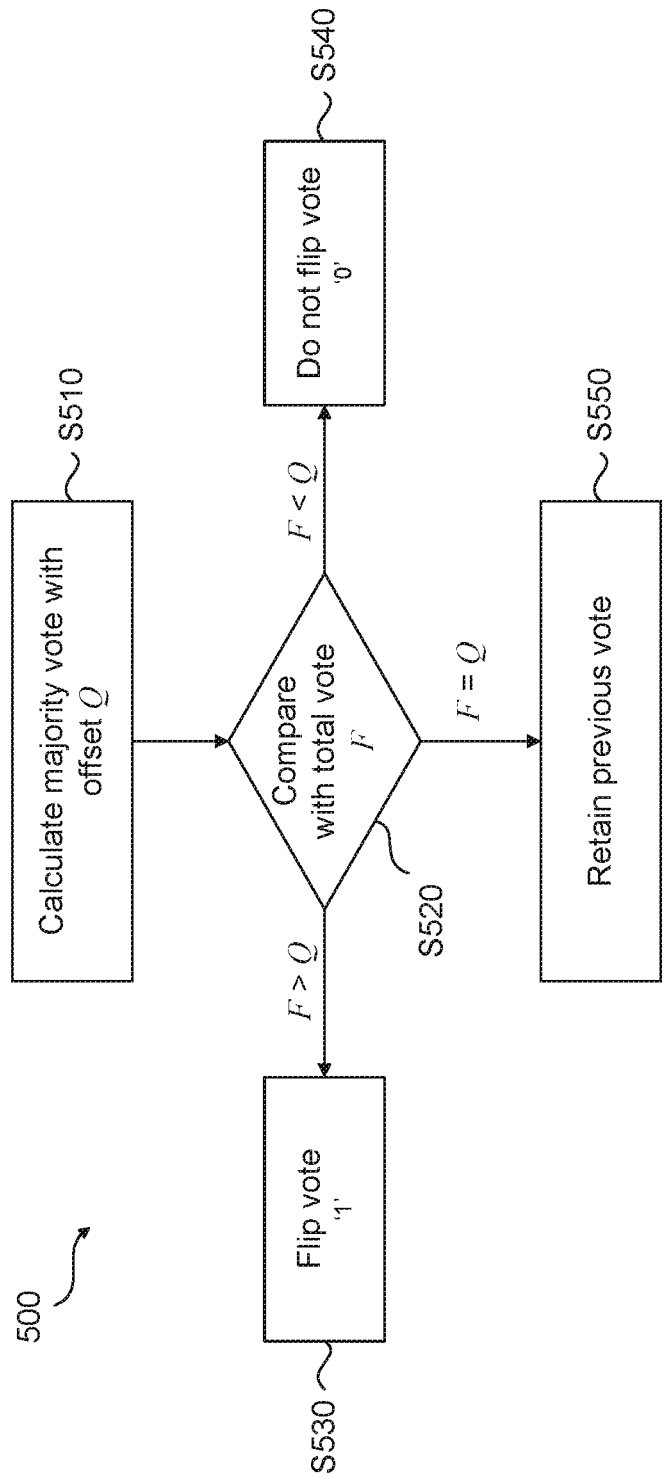
FIG. 5 illustrates a flow diagram determining a voting strategy based on an adjusted average algorithm according to an embodiment of the present disclosure.

A process flow for hard decision LDPC decoding using adjusted majority voting at each iteration of decoding will now be described in relation to FIG. 5. The process 500 begins at step S510 where the adjusted majority vote Q is calculated, where $Q=\frac{1}{2}(N+1+V_{it})$. In step S520, the total vote on the check nodes F is then determined and compared against Q. If F>Q, the bit value on the variable node is flipped. Else, if F<Q, the bit value on the variable node is not flipped, as shown in step S540. Else, if F=Q, as in step S550, the bit value on the variable node is retained from its value on the previous iteration.

The foregoing is merely illustrative of the principles of the disclosure, and the apparatuses can be practiced by other than the described implementations, which are presented for purposes of illustration and not of limitation. Variations and modifications will occur to those of skill in the art after reviewing this disclosure. The disclosed features may be implemented, in any combination and subcombination (including multiple dependent combinations and subcombinations), with one or more other features described herein. The various features described or illustrated above, including any components thereof, may be combined or integrated in other systems. Moreover, certain features may be omitted or not implemented.

Examples of changes, substitutions, and alterations are ascertainable by one skilled in the art and could be made without departing from the scope of the information disclosed herein. All references cited herein are incorporated by reference in their entirety and made part of this application.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

We claim:

1. A solid state storage device, comprising:
a non-volatile memory controller configured to store data in a non-volatile memory, wherein the stored data is encoded using a first error-correcting code (ECC) and a second Low Density Parity Check (LDPC) error-correcting code,
the non-volatile memory controller including a hard-decision LDPC decoder to decode encoded data received with errors from the non-volatile memory and provide a decoded data output, and
the hard-decision LDPC decoder selecting a voting scheme at each iteration in a sequence of iterations of decoding to determine when to implement bit flipping at a variable node amongst a plurality of check nodes, each of the plurality of check nodes connected to a plurality of variable nodes,
wherein the voting scheme is configured to count a number of votes from each of the check nodes and the variable node to determine when to implement the bit flipping at the variable node, the determination based on an evaluation of a static relationship between the number of votes and a number of the plurality of check nodes connected to a variable node of the plurality of variable nodes.

2. The solid state storage device of claim 1, wherein the hard-decision LDPC decoder reduces the number of errors in the decoded data to give partially decoded data containing errors where the first error-correcting code is capable of fully correcting the errors contained in the partially decoded data.

3. The solid state storage device of claim 2, further comprising an ECC decoder which completely decodes the partially decoded data containing errors to give fully decoded data containing no errors.

4. The solid state storage device of claim 3, wherein the ECC decoder is a Bose-Chaudhuri-Hocquenghem (BCH) decoder.

5. The solid state storage device of claim 1, wherein the LDPC decoder selects the voting scheme based on majority voting with a vote count offset with an adjustment value.

6. The solid state storage device of claim 5, wherein the adjustment value is dependent on an iteration sequence number of the iteration in the sequence of iterations used by the hard-decision LDPC decoder.

7. The solid state storage device of claim 5, wherein the adjustment value is predetermined.

8. The solid state storage device of claim 5, wherein the adjustment value for the first iteration is 1, the adjustment value for the last iteration is 0, and the adjustment value for each of the iterations between the first and last iterations is 1.

9. The solid state storage device of claim 1, wherein the hard-decision LDPC decoder flips the vote on a variable node from a previous iteration when:

$$2F>N+1+V_{it}$$

wherein
F is the number of votes to flip on the check nodes and the variable node connected to the check nodes,
N is the number of connected check nodes connected to a variable node, and
$V_{it}$ is an adjustment value at iteration it.

10. The solid state storage device of claim 1, wherein the hard-decision LDPC decoder retains the vote on a variable node from a previous iteration when:

$$2F=N+1+V_{it}$$

wherein
F is the number of votes to flip on the check nodes and the variable node connected to the check nodes,
N is the number of connected check nodes connected to a variable node, and
$V_{it}$ is an adjustment value at iteration it.

11. The solid state storage device of claim 1, wherein the hard-decision LDPC decoder does not flip the vote on a variable node from a previous iteration when:

$$2F<N+1+V_{it}$$

wherein
F is the number of votes to flip on the check nodes and the variable node connected to the check nodes,
N is the number of connected check nodes connected to a variable node, and
$V_{it}$ is an adjustment value at iteration it.

12. A method of improving the decoding of data encoded with a first error-correcting code (ECC) and a second Low Density Parity Check (LDPC) error-correcting code, implemented in a non-volatile memory having a non-volatile memory controller configured to store data in the non-volatile memory, the method comprising:
selecting a voting scheme at each iteration in a sequence of iterations of a hard-decision LDPC decoder of the second LDPC error-correcting code to determine when to implement bit flipping at a variable node amongst a plurality of check nodes, each of the plurality of check nodes connected to a plurality of variable nodes,
wherein the voting scheme is configured to count a number of votes from each of the check nodes and the variable node to determine when to implement the bit flipping at the variable node, the determination based on an evaluation of a static relationship between the number of votes and a number of the plurality of check nodes connected to a variable node of the plurality of variable nodes.

13. The method of claim 12, wherein the hard-decision LDPC decoder reduces the number of errors in the decoded data to give partially decoded data containing errors which the first error-correcting code can correct.

14. The method of claim 13, further comprising an ECC decoder which completely decodes the partially decoded data containing errors to give fully decoded data containing no errors.

15. The method of claim 14, wherein the ECC decoder is a Bose-Chaudhuri-Hocquenghem (BCH) decoder.

16. The method of claim 12, wherein the LDPC decoder selects the voting scheme based on majority voting with a vote count offset with an adjustment value.

17. The method of claim 16, wherein the adjustment value is dependent on an iteration sequence number of each iteration in the sequence of iterations used by the hard-decision LDPC decoder.

18. The method of claim 16, wherein the adjustment value is predetermined.

19. The method of claim 16, wherein the adjustment value for the first iteration is 1, the adjustment value for the last iteration is 0, and the adjustment value for each of the iterations between the first and last iterations is 1.

20. The method of claim 12, wherein the hard-decision LDPC decoder flips the vote on a variable node from a previous iteration when:

$$2F>N+1+V_{it}$$

wherein
F is the number of votes to flip on the check nodes and the variable node connected to the check nodes,
N is the number of connected check nodes connected to a variable node, and
$V_{it}$ is an adjustment value at iteration it.

21. The method of claim 12, wherein the hard-decision LDPC decoder retains the vote on a variable node from a previous iteration when:

$$2F=N+1+V_{it}$$

wherein
F is the number of votes to flip on the check nodes and the variable node connected to the check nodes,
N is the number of connected check nodes connected to a variable node, and
$V_{it}$ is an adjustment value at iteration it.

22. The method of claim 12, wherein the hard-decision LDPC decoder does not flip the vote on a variable node from a previous iteration when:

$$2F<N+1+V_{it}$$

wherein
F is the number of votes to flip on the check nodes and the variable node connected to the check nodes,
N is the number of connected check nodes connected to a variable node, and
$V_{it}$ is an adjustment value at iteration it.

23. A solid state storage device, comprising:
a non-volatile memory controller configured to store data in a non-volatile memory, wherein the stored data is encoded using a first error-correcting code and a second Low Density Parity Check (LDPC) error-correcting code, the non-volatile memory controller including:
- a hard-decision LDPC decoder to decode encoded data received from the non-volatile memory to generate partially decoded data containing errors which the first error-correcting code can correct, and
- a decoder of the first error-correcting code that receives the partially decoded data containing errors and generates fully decoded data containing no errors, and
- the hard-decision LDPC decoder selecting a voting scheme at each iteration in a sequence of iterations of decoding to determine when to implement bit flipping at a variable node amongst a plurality of check nodes, each of the plurality of check nodes connected to a plurality of variable nodes, wherein the decoder is configured to count a number of votes from each of the check nodes and the variable node to determine when to implement the bit flipping at the variable node, the determination based on an evaluation of a static relationship between the number of votes and a number of the plurality of check nodes connected to a variable node of the plurality of variable nodes.

* * * * *